United States Patent [19]

Hsue et al.

[11] Patent Number: 5,672,532

[45] Date of Patent: Sep. 30, 1997

[54] METHOD OF FORMING BIT LINES HAVING LOWER CONDUCTIVITY IN THEIR RESPECTIVE EDGES

[75] Inventors: Chen Chiu Hsue; Gary Hong, both of Hsin-Chu, Taiwan

[73] Assignee: United Microelectronics Corporation, Hsin-Chu, Taiwan

[21] Appl. No.: 242,787

[22] Filed: May 16, 1994

[51] Int. Cl.$^6$ ............................................. H01L 21/265
[52] U.S. Cl. ............................ 437/48; 437/52; 437/44
[58] Field of Search ............................ 437/47, 52, 48, 437/45, 44; 257/390–391

[56] References Cited

U.S. PATENT DOCUMENTS 5,362,662  11/1994  Ando et al. ............................ 437/48
5,418,175   5/1995  Hsue et al. ............................ 437/48
5,418,176   5/1995  Yang et al. ............................ 437/48

*Primary Examiner*—Jey Tsai
*Attorney, Agent, or Firm*—Meltzer, Lippe, Goldstein, et al.

[57] ABSTRACT

A buried bit line ROM is disclosed having orthogonal sets of buried bit lines and polysilicon word lines. Polysilicon spacers are disposed on either side of each of the bit lines. The polysilicon spacers are slightly doped. The bit lines have a doping profile so that the edges of each bit line is doped less and the center of each bit line is doped more.

19 Claims, 8 Drawing Sheets

… …

METHOD OF FORMING BIT LINES HAVING LOWER CONDUCTIVITY IN THEIR RESPECTIVE EDGES

FIELD OF THE INVENTION

The present invention relates to a process for making self-aligned buried $N_+$ bit lines in a semi-conductor device. Specifically, it relates to a high performance buried-bit line ("B/L") mask ROM process which is suitable for very high density ROM product.

RELATED APPLICATION

A patent application entitled "Buried Bit Line ROM with Low Bit Line Resistance" bearing Ser. No. 08/092,189 was filed on Jul. 14, 1993, now U.S. Pat. No. 5,430,673 and is assigned to the assignee hereof. This application contains subject matter related to the subject matter of the present application and is hereby incorporated by reference.

BACKGROUND OF THE INVENTION

A ROM is an array of ROM cells. A top view of a conventional array of ROM cells is shown in FIG. 2. A cross-section of an individual ROM cell is shown in FIG. 1. A ROM array has some cells which are conductive and some cells which are not conductive. A ROM mask process allows selective implantation of the ROM code so that some cells are conductive and some are not.

Referring to FIG. 2, the ROM array is formed on a substrate 11. Illustratively, a p-type substrate is used. A plurality of $N^+$ buried bit lines 12 are formed in the substrate 11. A plurality of word lines 14 are also formed on the surface of the substrate orthogonal to the bit lines.

The cross-section of the individual ROM cell of FIG. 1 is taken along the AA' line of FIG. 2. Each cell of the ROM has two parallel buried bit lines 12 which form source and drain regions for the cell. A channel 3 is formed between the two bit lines in the cell. A gate oxide layer 4 is formed on top of the substrate 1. The oxide layer 4 is thick at portions designated 5 which are located above the bit lines 2 and thin at portions designated 6 located over the channel 3. A polysilicon word line 7 is formed over the oxide gate layer 4. A photo resist layer 8 is formed and patterned on the polysilicon layer as a mask. The photo-resist layer is patterned so that the polysilicon layer across the source/drain region makes the channel conducting when a voltage is applied on the polysilicon layer. The boron 9 is then implanted in the selected cells to turn off the conducting state for the "off" cell (this programs the cell).

Each bit line has a width W. The spacing between adjacent bit lines is S. Illustratively, W is 0.6 microns and S is 0.6 microns. When the cell dimension shrinks, i.e., a smaller device size, the bit line width also shrinks and the bit line sheet resistance increases. In addition, the punch-through voltage between adjacent bit lines becomes unacceptably low.

It is an object of the present invention to provide a buried bit line structure and a method for making a buried bit line structure which eliminates the sheet resistance and punch through voltage problems in high density buried bit line ROMs with small bit line width and small bit line spacing.

SUMMARY OF THE INVENTION

The present invention uses an extra polysilicon layer in self-aligned direct contact with an $N^+$ buried bit line and without any trenches in the device area. Additionally, the process incorporates a lightly doped ("LDD") effect in the $N^+$ bit line that improves the ROM coded cell breakdown voltage and leakage.

DETAILED DESCRIPTION OF THE INVENTION

Figure 1:
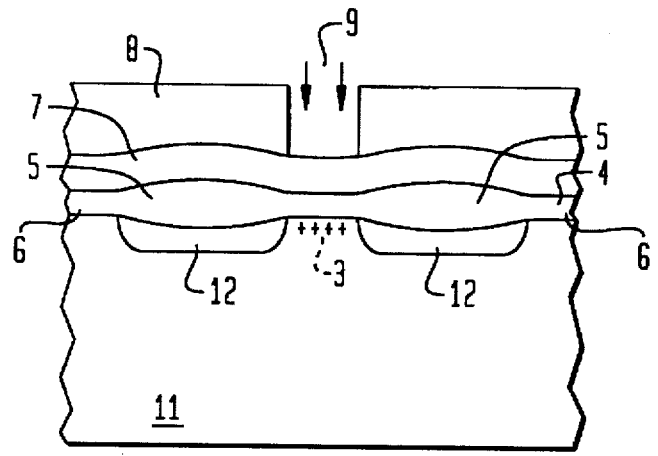
FIG. 1 illustrates a cross section of a conventional buried bit line ROM cell.
Figure 2:
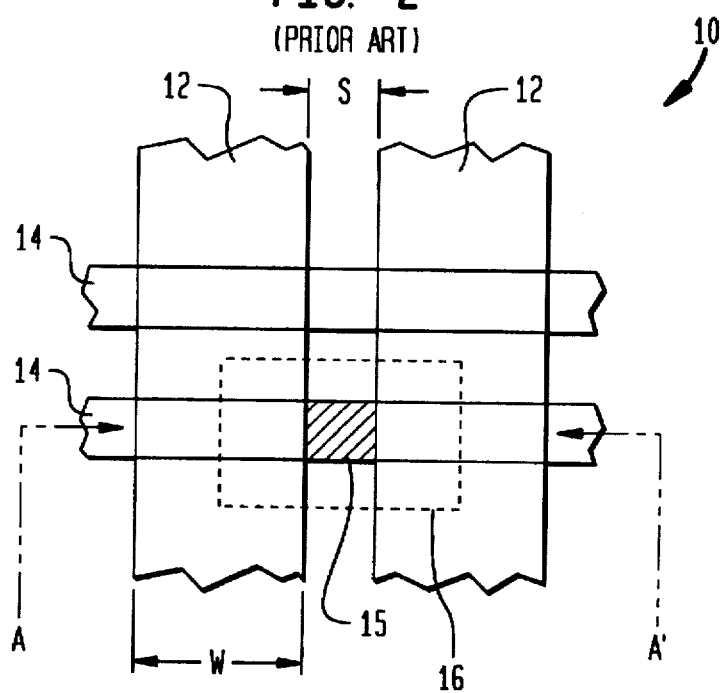
FIG. 2 illustrates a top view of a buried bit line mask ROM array.
Figure 3A:
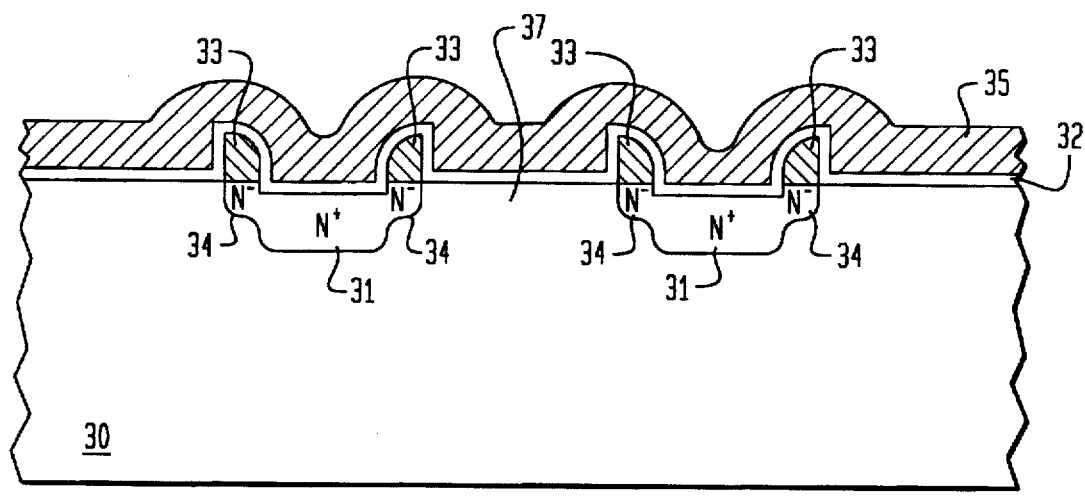
FIG. 3(a) and (b) illustrate two embodiments of the device of the present invention.
Figure 3B:
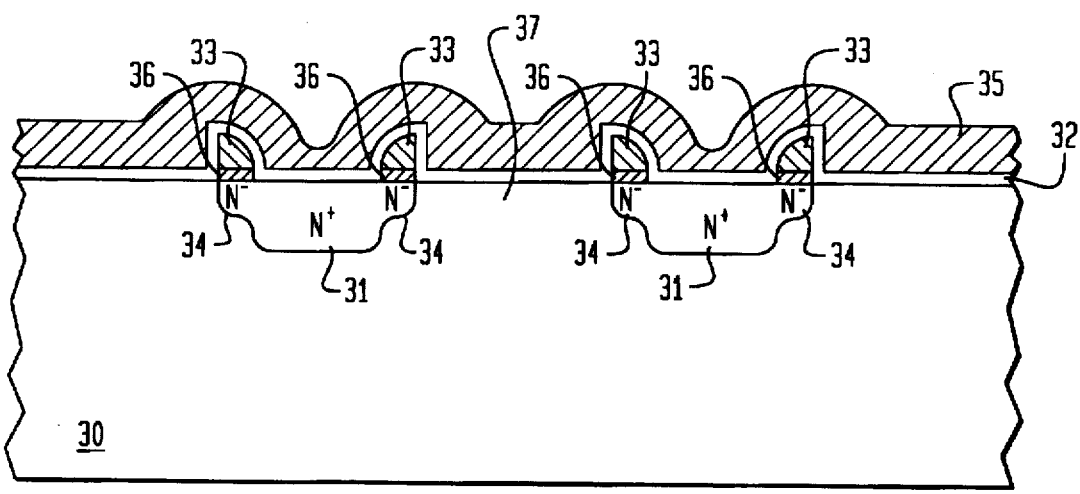

FIGS. 3(a) and 3(b) illustrate buried bit line ROM cells of the present invention. The ROM cell comprises a substrate 30 of a first dopant type having buried bit lines 31 of a second dopant type. Illustratively, the substrate is p-type and the bit lines are $N^+$. The bit lines 31 are disposed parallel to each other. Polysilicon spacers 33 are deposited on either side of each bit line 31. The bit lines 31 have a doping profile such that the portion 34 of the bit lines 31 under the spacers 33 are doped less then the center of the bit lines 31. This doping profile is a result of the polysilicon spacers which are doped $N^-$. Because the bit lines are doped less at their edges than at their centers the punch-through voltage is increased. A gate oxide layer 32 is deposited over the spacers 33. A word line 35 is deposited over the gate oxide 32. The word line 35 is oriented orthogonally to the bit lines 31. A channel region 37 can be made non-conducting via implantation.

In an alternative embodiment shown in FIG. 3(b), an additional oxide layer 36 is deposited between the spacers 33 and the bit lines 31.

Figure 4A:
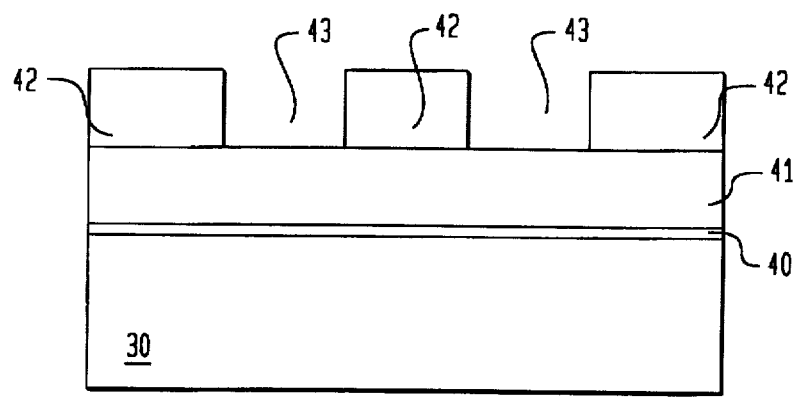
FIGS. 4(a) to (h) illustrate the process of forming one embodiment of the present invention.
Figure 4B:
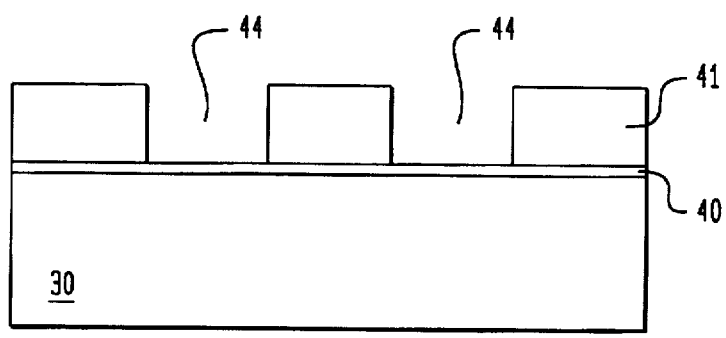

The process for forming the ROM cell of the present invention is illustrated in FIGS. 4(a)–4(h) and 5(a) to 5(h). As shown in FIGS. 4(a) and 5(a), the starting point for this process is a p-type silicon substrate 30. An oxide layer ($SiO_2$) 40 is deposited on the surface of the substrate 30. The oxide layer is between 100 and 200 Å (Angstroms). This oxide layer is the gate oxide. Next, a silicon nitride layer 41 is deposited on top of the oxide layer 40. The nitride layer is between 2000 and 3000 Å.

Figure 5A:
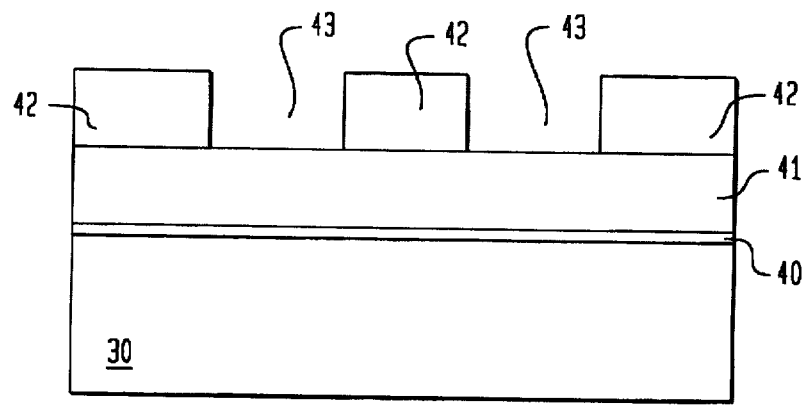
FIGS. 5(a) to (h) illustrate the process of forming another embodiment of the present invention.
Figure 5B:
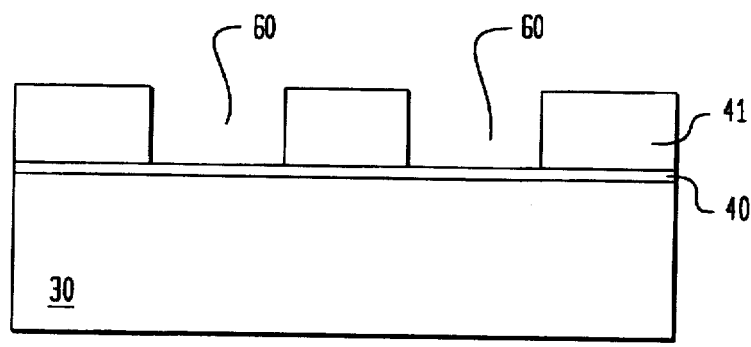

A layer of photo-resist is then deposited on the nitride layer 41. The photo-resist is then patterned to form the photo-resist stripes 42 which are separated by openings 43. Using the photo-resist stripes as a mask, the nitride layer 41 is etched, e.g., by dry etch, and, then, the photo-resist stripes 42 are removed. The resulting trenches 44 in the layer 41 are shown in FIG. 4(b). In an alternative embodiment, the nitride layer 41 and oxide layer 40 are etched, thereby forming trenches 60 into the substrate 30, as shown in FIG. 5(b).

Figure 4C:
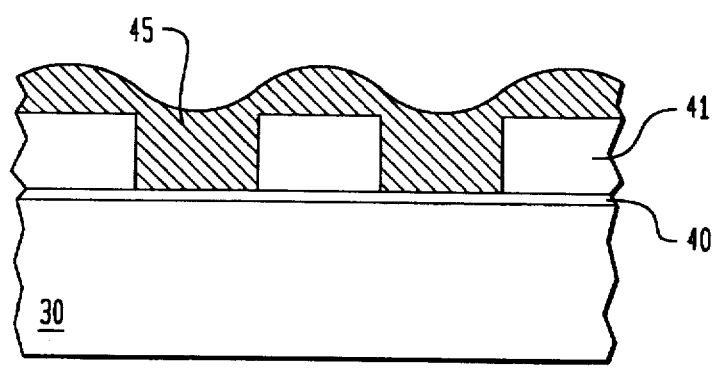
Figure 4D:
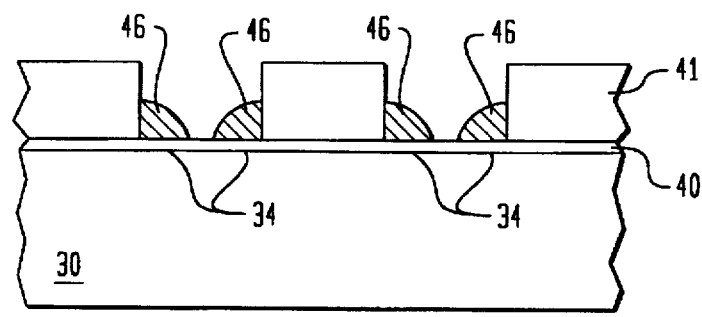
Figure 4E:
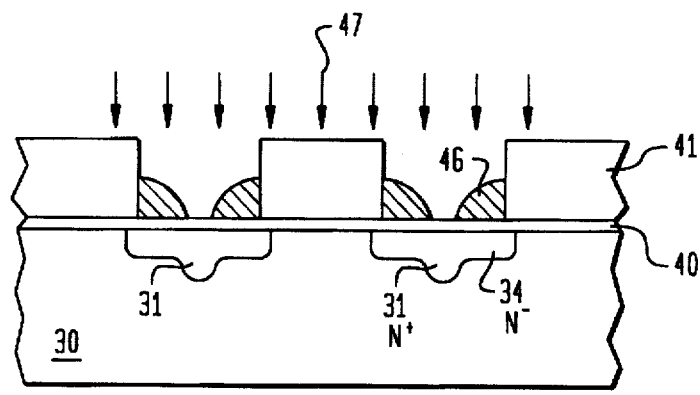
Figure 5C:
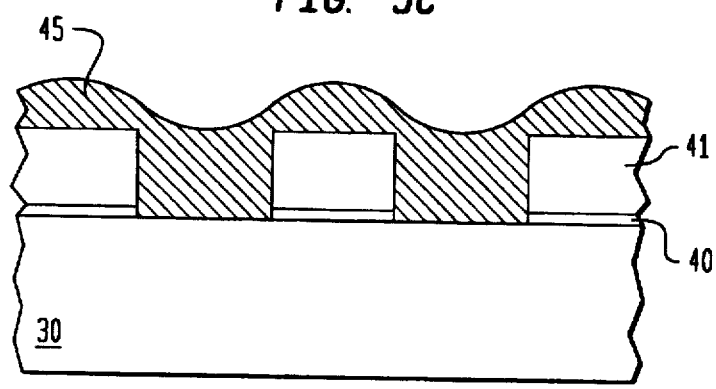
Figure 5D:
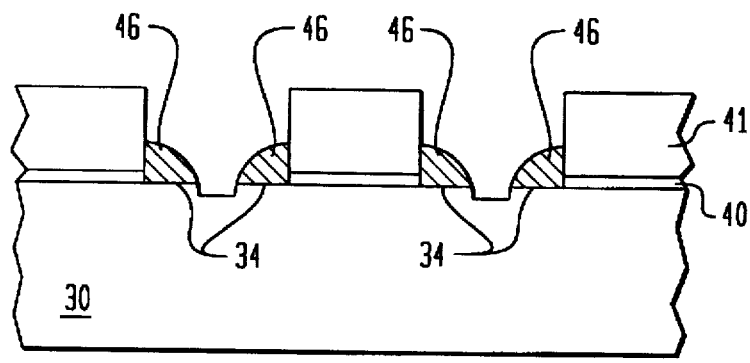
Figure 5E:
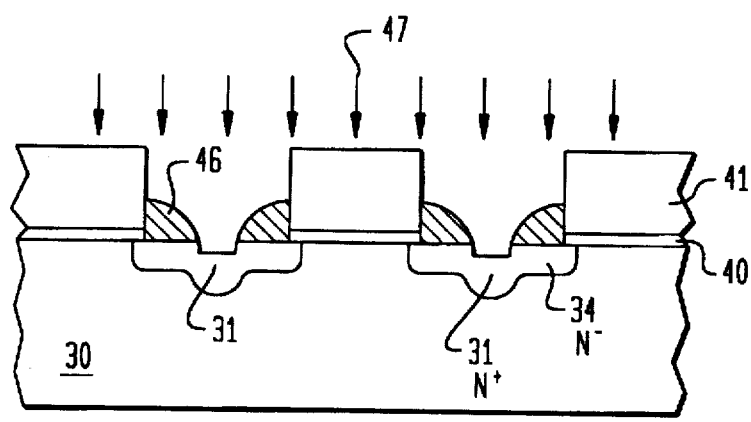

Referring to FIGS. 4(c) and 5(c), a polysilicon layer 45 is deposited in trenches 44 and 60, respectively, to a thickness between 2000 and 3000Å. A polysilicon spacer 46 ("poly 1 spacer 46") is formed by anisotropic plasma etch or overetch of the polysilicon layer, as shown in FIGS. 4(d) and 5(d). The area 34 of the substrate 30 is lightly doped because of dopants in the polysilicon spacer 46. These polysilicon dopants are $N^-$. Phosphorous is implanted through the spacers 46 to form bit lines 31, as shown in FIGS. 4(e) and 5(e), by ion implantation, as indicated by arrows 47, at an energy of approximately 50 to 100 keV. The implantation creates N buried bit lines 31 in the substrate. The dose of the $N^+$ dopant is $1\times10^{15}/cm^2$. The poly spacers block some of the implanted $N^+$ dopant, therefore, the region 34 becomes $N^-$. Since the poly spacer has a sloped shape, the $N^-$ region 34 has the shape as indicated in FIG. 4(e) and 5(e). This doping of the area in the channel beneath the poly 1 spacer 46 creates a $N^+/N^-$ doping profile. This light doping increases the punch-through voltage from bit line to bit line.

Figure 4F:
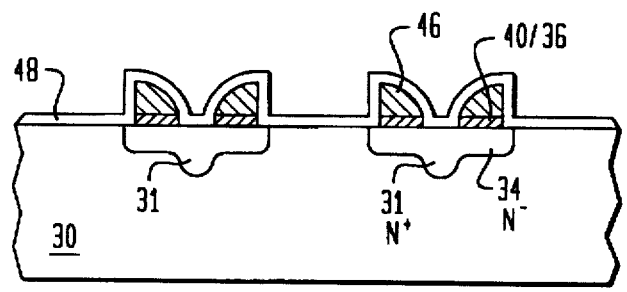
Figure 5F:
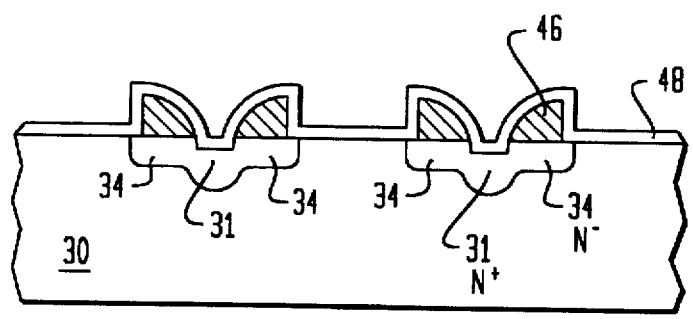

The nitride layer stripes 41 are etched or stripped away and, then the oxide layer 40 is etched, as shown in FIGS. 4(f) and 5(f). A gate oxide layer 48, shown as 32 in FIGS. 3(a) and (b), is regrown by oxidation over the poly 1 spacer 46. This gate oxide 48 has a thickness between 90 and 150Å. The original oxide layer 40 may remain between the spacers 46 and the buried bit lines 31. In the embodiment of FIG. 4(f), a portion of the oxide layer 40 remains between the spacers 46 and the bit lines 31. This portion is shown as 36 in FIG. 3(b).

Figure 4G:
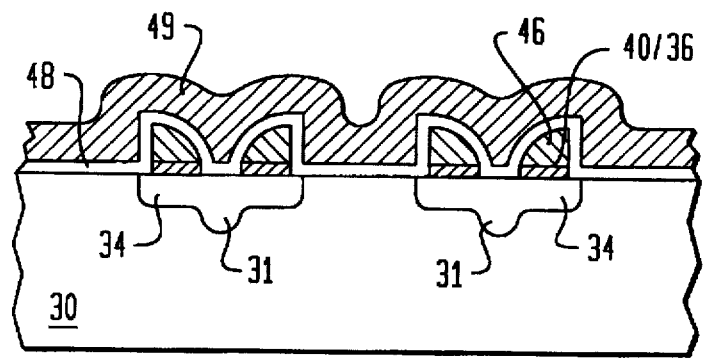
Figure 5G:
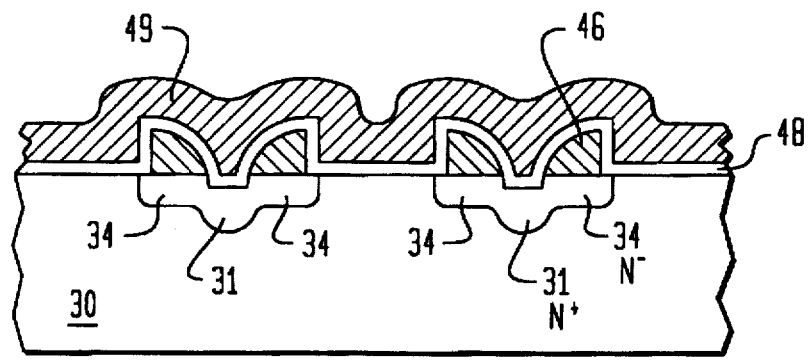

Next, referring to FIGS. 4(g) and 5(g), a polysilicon word line 49 ("poly 2 word line 49") is deposited or formed over the gate oxide 48. The poly word fine is patterned by conventional masking processes and etching processes. This process is not shown in the figures.

Figure 4H:
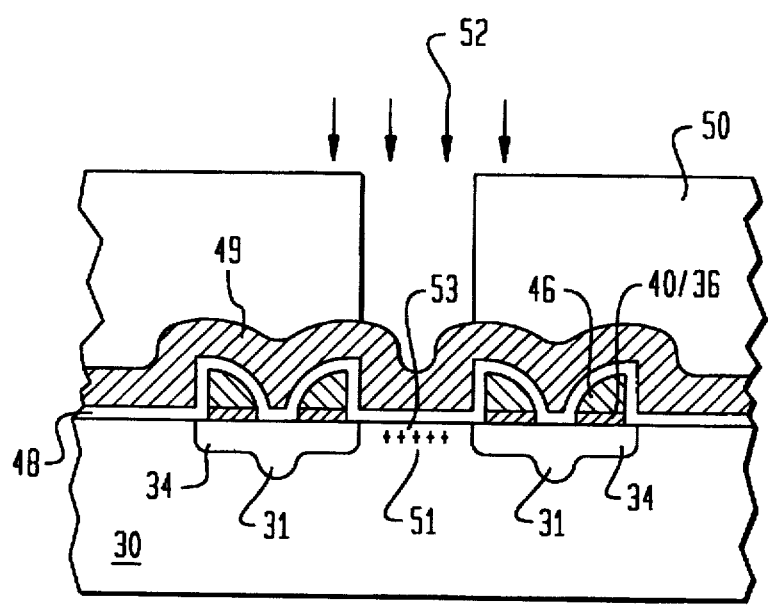
Figure 5H:
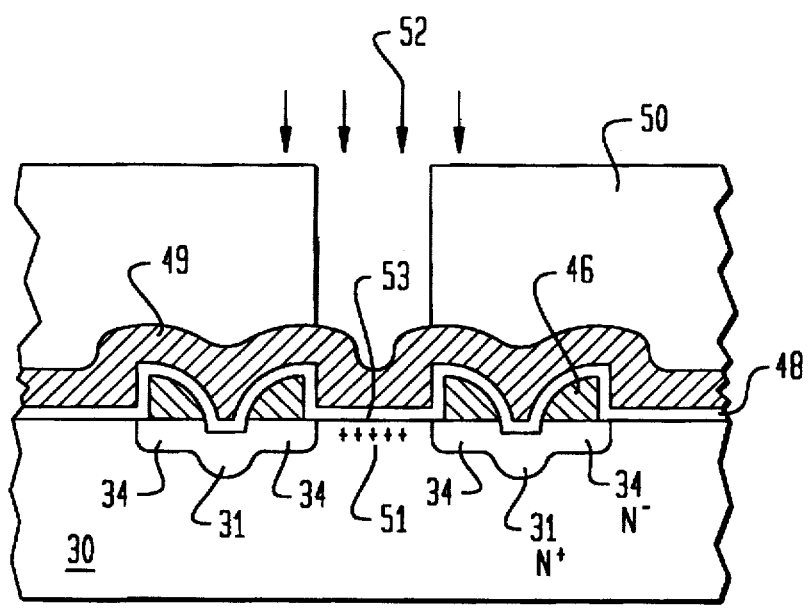

As shown in FIGS. 4(h) and 5(h), the poly 2 word line 49 is now masked and etched. A layer of photo-resist 50 is deposited on the poly 2 word line 49. The photo-resist layer 50 is formed into stripes for ROM code masking. A boron ROM code 51 is then implanted, as indicated by the arrows 52, between the spacers 46 and the buried bit lines 31, i.e, in the channel region 51. The boron implantation occurs by using an energy of about 150 kev and a dose of about $1\times10^{14}/cm2$. The selected boron ion may be $B_{11}$. The ROM code implant is an implanted Boron ion which is self-aligned.

The rest of the process steps for completing the ROM are conventional back-end processes including BPSG, contacts, metallization and passivation.

The process and product of the present invention have many advantages, including:

1. The bit line $N^+$ implant using phosphorous ($P^{31}$) through the sloped poly 1 spacer creates a $N^+/N^-$ doping profile, which has the LDD effect. This doping profile and LDD effect is advantageous for better punch-through resistance in a smaller device size.

2. For the cell shown in FIG. 3(b), when the poly 2 word line is applied with a voltage, some fraction of this voltage is coupled to part of the poly 1 spacer above the $N^-$ area, therefore, the read or cell current of the memory transistor will increase due to an effect similar to a fully overlapped LDD structure.

3. The ROM code implant will be self-aligned into the center area of the channel resulting in a higher breakdown voltage and lower bit line resistance.

Finally, the above-described embodiment of the invention are intended to be illustrated only. Numerous alternative embodiments may be devised by those skilled in the art without departing from the spirit and scope of the following claims.

We claim:

1. A method for producing a buried bit line ROM cell comprising:

(a) forming at least one layer on a semiconducting substrate and forming at least two trenches in said at least one layer, (b) depositing first and second doped polysilicon spacers on the sidewalls of said trenches, (c) forming first and second buried bit lines in said semiconducting substrate through said spacers, wherein said first and second bit lines have a first conductivity type and said semiconducting substrate has a second conductivity type, so that said bit lines have a doping profile such that the conductivity of the bit lines is less at the edges of said bit lines and more at the center of said bit lines, (d) forming an oxide layer over said spacers, bit lines and semiconducting substrate, and (e) depositing a word line over said oxide layer and oriented orthogonally to said bit lines.

2. The method of claim 1, wherein said first conductivity type is p-type and said second conductivity type is $N^+$.

3. The method of claim 2 wherein said doping profile is $N^-$ at said edges of said bit lines and $N^+$ at said center of said bit lines.

4. The method claim 1, wherein said oxide layer is a gate oxide layer.

5. A process for producing a buried bit line ROM cell comprising:

(a1) depositing a first oxide layer on a semiconducting substrate;

(a2) depositing a nitride layer on said first oxide layer;

(a3) masking said nitride layer;

(a4) etching said nitride layer through said mask to form said trenches in said nitride layer;

(b) depositing first and second doped poly silicon spacers on the sidewalls of said trenches;

(c) forming first and second buried bit lines in said semiconducting substrate through said spacers, wherein said first and second bit lines have a first conductivity type and said semiconducting substrate has a second conductivity type, so that said bit lines have a doping profile such that the conductivity of the bit lines is less at the edges of said bit lines and more at the center of said bit lines;

(d) forming an oxide layer over said spacers, bit lines and semiconducting substrate;

(e1) removing said nitride layer and said first oxide layer;

(e2) depositing a polysilicon layer over said oxide layer to form said word line;

(f) masking and patterning said polysilicon layer for ROM code masking; and (g) implanting ROM code between said spacers and said buried bit lines.

6. The process of claim 5, wherein said implanted ROM code is boron.

7. The process of claim 5, step (a3) comprises, (a3i) depositing a layer of photo resist on said nitride layer; and (a3ii) patterning said photo resist to form stripes.

8. The process of claim 5, wherein step (b) comprises, b1) forming a first layer of doped polysilicon in said trenches, and b2) etching said first layer of polysilicon to form said spacers.

9. The process of claim 5, wherein said second conductivity type is p-type and said first conductivity type is $N^+$.

10. The process of claim 8, wherein said second conductivity type is p-type and said first conductvity type is $N^+$.

11. The process of claim 10, wherein said first conductivity type $N^+$ is phosphorous.

12. The process of claim 5, wherein step (f) comprises, (f1) depositing a layer of photo resist on said polysilicon layer; and (f2) patterning said photo resist to form stripes over said bit lines and spacers.

13. The process of claim 5, further comprising etching said first oxide layer along with said nitride layer in step (d) thereby forming trenches into said substrate.

14. The method of claim 1, wherein said semiconducting substrate is silicon.

15. The method of claim 1, wherein said at least one layer having a greater etch resistance includes at least one of a silicon oxide layer and a nitride layer.

16. The method of claim 5, wherein said semiconducting substrate is silicon.

17. A method for producing a buried bit line ROM cell comprising:

(a) forming at least one insulation layer on a semiconducting substrate and forming at least two trenches in said at least one insulation layer, (b) depositing first and second doped polysilicon spacers on the sidewalls of said trenches, (c) forming first and second buried bit lines in a substrate through said spacers, wherein said first and second bit lines have a first conductivity type and said semiconducting substrate has a second conductivity type, so that said bit lines have a doping profile such that the conductivity of the bit lines is less at the edges of said bit lines and more at the center of said bit lines, (d) forming an oxide layer over said spacers, bit lines and semiconducting substrate, and (e) depositing a word line over said oxide layer and oriented orthogonally to said bit lines.

18. The method of claim 17, wherein said semiconducting substrate is silicon.

19. The method of claim 17, wherein said at least one layer insulation layer includes at least one of a silicon oxide layer and a nitride layer.

* * * * *